(12) United States Patent
Andersen et al.

(10) Patent No.: US 11,874,393 B2
(45) Date of Patent: Jan. 16, 2024

(54) PULSE GENERATOR

(71) Applicant: Novelda AS, Kviteseid (NO)

(72) Inventors: Nikolaj Andersen, Oslo (NO); Kristian Granhaug, Oslo (NO)

(73) Assignee: Novelda AS, Kviteseid (NO)

(*) Notice: Subject to any disclaimer, the term of this patent is extended or adjusted under 35 U.S.C. 154(b) by 0 days.

(21) Appl. No.: 17/721,197

(22) Filed: Apr. 14, 2022

(65) Prior Publication Data

US 2022/0236371 A1    Jul. 28, 2022

Related U.S. Application Data

(63) Continuation of application No. 16/483,167, filed as application No. PCT/EP2018/052580 on Feb. 1, 2018, now abandoned.

(30) Foreign Application Priority Data

Feb. 3, 2017 (GB) .................................. 1701849

(51) Int. Cl.
| | |
|---|---|
| *G01S 7/282* | (2006.01) |
| *H03K 3/013* | (2006.01) |
| *H03K 3/354* | (2006.01) |
| *H03K 4/92* | (2006.01) |

(Continued)

(52) U.S. Cl.
CPC .............. *G01S 7/282* (2013.01); *H03K 3/013* (2013.01); *H03K 3/354* (2013.01); *H03K 4/92* (2013.01); *H03K 5/135* (2013.01); *G01S 13/0209* (2013.01)

(58) Field of Classification Search
None
See application file for complete search history.

(56) References Cited

U.S. PATENT DOCUMENTS

| | | | |
|---|---|---|---|
| 6,748,022 B1* | 6/2004 | Walker | H04L 25/4902 375/289 |
| 7,265,598 B2* | 9/2007 | Kabelly | H03K 3/33 342/85 |

(Continued)

FOREIGN PATENT DOCUMENTS

EP    1 458 090 A1    9/2004

OTHER PUBLICATIONS

Decision of Rejection (with English translation) for corresponding Chinese patent application No. 201880009973.8, dated May 20, 2023, 22 pages.

*Primary Examiner* — Thomas J. Hiltunen
*Assistant Examiner* — Khareem E Almo
(74) *Attorney, Agent, or Firm* — Klarquist Sparkman, LLP

(57) ABSTRACT

A pulse generator comprising: a first signal generating arm comprising a first inductor and a plurality of switching elements, each arranged to draw current through the first inductor; and a controller arranged to activate the plurality of switching elements in a predetermined sequence so as to generate a predetermined pulse waveform at a pulse generator output. The switching elements of the signal generating arm and the inductor together form a pulse synthesizer that takes the signal from the controller and uses it to synthesize an output pulse. Compared with conventional transmitter architectures, the functions of the upconversion mixer, the DAC, and the power amplifier are all performed by a single simplified circuit. This is both area efficient and power efficient.

27 Claims, 11 Drawing Sheets

(51) Int. Cl.
*H03K 5/135* (2006.01)
*G01S 13/02* (2006.01)

(56) References Cited

U.S. PATENT DOCUMENTS

| | | | | |
|---|---|---|---|---|
| 7,439,817 | B2* | 10/2008 | Waheed | H03L 7/101 |
| | | | | 331/177 V |
| 7,460,612 | B2* | 12/2008 | Eliezer | H03F 3/24 |
| | | | | 375/295 |
| 7,619,470 | B2* | 11/2009 | Abe | H03F 3/2176 |
| | | | | 330/251 |
| 7,979,036 | B2* | 7/2011 | Zheng | H03K 5/07 |
| | | | | 375/295 |
| 8,675,725 | B2* | 3/2014 | Staszewski | H04B 14/026 |
| | | | | 330/136 |
| 9,071,204 | B2* | 6/2015 | Pamarti | H03F 1/0205 |
| 9,450,798 | B2* | 9/2016 | Muhammad | H04B 1/0475 |
| 9,634,563 | B2* | 4/2017 | Chen | H02M 3/156 |
| 9,660,599 | B2* | 5/2017 | Dally | H03F 3/24 |
| 2009/0096525 | A1* | 4/2009 | Staszewski | H03F 3/602 |
| | | | | 330/277 |
| 2010/0188148 | A1* | 7/2010 | Mehta | H03F 1/3247 |
| | | | | 330/149 |
| 2011/0267127 | A1* | 11/2011 | Staszewski | H03M 1/68 |
| | | | | 327/306 |
| 2012/0038424 | A1* | 2/2012 | Guo | H03F 3/607 |
| | | | | 330/295 |
| 2013/0181746 | A1* | 7/2013 | Granhaug | G01S 13/18 |
| | | | | 327/77 |
| 2014/0049318 | A1* | 2/2014 | Goswami | H03M 1/008 |
| | | | | 330/253 |
| 2014/0355774 | A1* | 12/2014 | Quan | H04R 29/00 |
| | | | | 381/58 |
| 2015/0023511 | A1* | 1/2015 | Quan | H04R 29/004 |
| | | | | 381/58 |
| 2016/0269075 | A1* | 9/2016 | Masson | H04B 1/7174 |
| 2016/0294440 | A1* | 10/2016 | Masson | H04L 25/03834 |
| 2017/0257084 | A1* | 9/2017 | Mendez | G01S 7/282 |
| 2022/0013984 | A1* | 1/2022 | Letor | H01S 5/0261 |

* cited by examiner

PULSE GENERATOR

CROSS REFERENCE TO RELATED APPLICATIONS

This is continuation of U.S. application Ser. No. 16/483,167, filed Aug. 2, 2019, which is the U.S. National Stage of International Application No. PCT/EP2018/052580, filed Feb. 1, 2018, which was published in English under PCT Article 21(2), which in turn claims the benefit of Great Britain Application No. 1701849.0, filed Feb. 3, 2017.

The invention relates to an RF pulse generator, especially for use in impulse radar applications such as ultra-wideband (UWB) radar.

By way of background, several different transmitter architectures are known for sending complex signal waveforms, typically for data transmission as well as ranging and sensing applications. Two commonly used conventional transmitter architectures are shown in FIGS. 1a and 1b.

FIG. 1a shows a direct conversion transmitter in which a baseband signal is split, typically into in-phase (I) and quadrature (Q) signals which are then processed in separate transmitter arms. In each arm, the data (or "modulating") signal (I or Q) is converted to the analogue domain by the DAC and low pass filtered to remove unwanted harmonics. A phase locked loop (PLL) generates a carrier wave and a 90 degree phase-shifter splits this into two orthogonal carrier waves, one for each transmitter arm. The carrier waves are mixed with the data signal, producing the "modulated" output signal, and then the two arms are combined (added) before amplification by the power amplifier (PA) and transmission (e.g., via antenna).

FIG. 1b shows a similar approach, but instead of decomposing the data into in-phase and quadrature data streams, one data stream is used for phase modulation (via PLL), while the other is then used for a subsequent amplitude modulation by adjusting the gain on the amplifier (PA).

A key difference between these two transmitter architectures is that the direct conversion transmitter operates in a Cartesian coordinate system, while the polar transmitter operates in a polar coordinate system.

A basic switched-mode power amplifier is shown in FIG. 2. This is a non-linear power amplifier. The switch is used to modulate the current through the inductor. By appropriate scaling of the bias inductor (L), the ac-coupling capacitor (C) and the output load ($Z_L$) a desired output waveform across $Z_L$ can be generated.

The aforementioned transmitter circuits are designed for general data transmission by generating a waveform based on an incoming data stream that can later be demodulated and recovered. However, specific waveform generation can also be useful in generating shaped pulses such as may be used in impulse radar applications. For example, in UWB impulse radars, a Gaussian-derivative pulse shape is generally preferred to maximise the power that can be transmitted within the permitted frequency mask (although any pulse with adequate mask utilization may be used). By tuning the bandwidth and centre-frequency of the Gaussian-derivative pulse the transmit power can be adjusted to fill as much as possible of the permitted spectrum within the regulatory power limits.

Power consumption is an important consideration in many impulse radar applications, particularly for example in relation to portable devices, such as may be used in portable or battery-powered detectors. Purely by way of example, wearable devices need to have a small form factor, and thus be able to operate on limited battery power. It is therefore desirable to maximise battery life by minimizing power consumption.

Previous attempts to generate impulse radar pulses at low power have used non-clocked solutions in order to avoid the relatively high power consumption associated with clocking. For example, the pulse generator of WO2012/038732 employs an open loop delay line to generate the output pulse. As a trigger signal passes along the delay line it fires alternately pull-up transistors and pull-down transistors which alternately connect the output node to high and low voltages to create the output pulse waveform. The sizes of the transistors are tuned accordingly to shape the envelope of the output pulse. The common output node is biased at $V_{DD}/2$ via a pair of resistors with the pull-up and pull-down transistors pulling the output voltage towards either $V_{DD}$ or ground. However, while this arrangement is particularly power-efficient, there can be problems for certain implementations on account of variations in the output frequency due to the open-loop nature of the delay line. For example temperature variations can cause the frequency to change. Also variability in the manufacturing process can affect the output frequency. Such variations can result in regulatory non-compliance by violating the spectrum mask. Alternatively, if the spectrum is reduced so as to ensure compliance, then the pulse generator is not making the optimal use of the available spectrum. To mitigate these effects, timing measurement circuits and programmable delay lines may be used, but these all add to chip area and reduce the power efficiency of the circuit.

According to a first aspect, the invention provides a pulse generator comprising: a first signal generating arm comprising a first inductor and a plurality of switching elements, each arranged to draw current through the first inductor; and a controller arranged to activate the plurality of switching elements in a predetermined sequence so as to generate a predetermined pulse waveform at a pulse generator output.

The switching elements of the signal generating arm and the inductor together form a pulse synthesizer that takes the signal from the controller and uses it to synthesize an output pulse. Compared with conventional transmitter architectures (such as those illustrated in FIGS. 1a and 1b), the functions of the upconversion mixer, the DAC, and the power amplifier are all performed by a single simplified circuit. This is both area efficient and power efficient.

The use of an inductor to bias the amplifier provides a power saving compared with the earlier design in which the central node was biased around $V_{DD}/2$ by a pair of resistors. In the earlier design, these resistors dissipated a small amount of DC power proportional to their resistance. The inductor does not dissipate any DC power and therefore this arrangement is more power efficient. There are other benefits as well, such as improved noise handling capability (better Power Supply Rejection Ratio), and the potential for exploiting the resonance for harmonic attenuation (although this may be better handled in subsequent stages).

A further advantage of the inductor is that it can be sized so as to form a resonator with a capacitance. The capacitance may be a component added to the circuit, a parasitic capacitance that is already present or a combination of the two. The inductor size can be selected so as to set the resonant frequency close to the switching frequency so that the switching sequence of the switching elements causes resonance that drives the output voltage above $V_{DD}$, thus further amplifying the signal and providing more output power without drawing further power from the power supply.

The inductor is preferably an on-chip component, i.e. manufactured as part of the chip fabrication process rather than as a separate off-chip component. It should be noted that inductors are generally physically large components compared with other CMOS devices, and they usually require a separate fabrication technique to deposit a thick metal layer from which to form the inductor. However the advantages listed above outweigh these potential disadvantages.

Although a single-ended pulse generator is useful and perfectly functional, there are additional benefits to providing a differential arrangement. Accordingly, in preferred embodiments the pulse generator further comprises: a second signal generating arm comprising a second inductor and a plurality of switching elements, each arranged to draw current through the second inductor; and wherein the controller is arranged to activate the plurality of switching elements of the first and second signal generating arms in a predetermined sequence so as to generate a predetermined pulse waveform as a differential signal between a first pulse generator output on the first signal generating arm and a second pulse generator output on the second signal generating arm.

Preferably the plurality of switching elements in the first signal generating arm are arranged to draw different amounts of current. Also, in the differential arrangements the plurality of switching elements in the second signal generating arm are preferably arranged to draw different amounts of current. By providing different switching elements with different current drawing capabilities the pulse generator can generate peaks and troughs in the output pulse of different amplitude. Thus, the envelope of the output pulse can be tuned/adjusted with greater flexibility. The different current drawing abilities of the switching elements may be achieved in any suitable way, but in preferred embodiments the switching elements are transistors and the current drawing ability is defined by appropriate sizing of the transistors. For example the dimensions (width and length) of the transistor structure define its operating characteristics. In other examples, the different current drawing ability could be achieved through biasing the gate or bulk differently, loading the drain or degenerating the source. One could also exploit 2nd-order effects like LOD (length of diffusion) or distance to well.

The different switching elements of the two signal generating arms may be triggered in any order. For example, two switching elements of different current drawing capability may be triggered on the first signal generating arm to produce two positive output levels before any switching elements on the second arm are triggered to produce negative output levels. However, in particularly preferred arrangements the pulse generator is arranged to generate an oscillating output waveform by alternating between the two arms. Thus, in preferred embodiments the controller is arranged to activate switching elements of the first signal generating arm and the second signal generating arm alternately so as to produce an oscillating output. The sizing and ordering of the switching elements defines the envelope of the output pulse as described above.

Different pulse shapes may be achieved with this arrangement. For example, an oscillating waveform with a decaying exponential envelope may be achieved by triggering switching elements with higher current draw first and then triggering switching elements with lower current draw, etc. However, in some particularly preferred embodiments the controller is arranged to activate the switching elements in an order such that current drawn through successive switching elements of each signal arm increases then decreases. This forms an output pulse with an envelope amplitude that rises to a maximum and then decreases again (with an oscillating waveform inside the envelope).

One example of such a waveform could be with a linear rise in amplitude so as to form a triangular waveform (or rather two triangular waveforms back-to-back). However, one particularly preferred arrangement is to approximate a Gaussian envelope. Thus the switching order (i.e. the predetermined sequence) of the switching elements is preferably arranged to create an approximate Gaussian derivative pulse shape. The number of oscillations that occurs within the overall Gaussian envelope determines the derivative-order of the Gaussian derivative pulse. It will be appreciated that at high frequencies such approximations can be quite coarse and the resulting signal amplitudes may not be precisely of Gaussian envelope amplitude. However, the closer the approximation can be, the closer the spectrum of the output pulse will be to the desired spectrum. Such Gaussian derivative pulses are of particular interest in UWB applications for maximising power transmission within the regulation permitted spectrum mask.

As discussed above, preferably the or each switching element is connected through the respective inductors to a high voltage rail of the circuit that encompasses it, e.g. $V_{DD}$. The inductor is preferably connected between the high voltage rail and the output of its respective signal generating arm. This arrangement is preferred for n-type devices (e.g. NMOS devices). However, it will be appreciated that for an equivalent circuit with p-type devices (e.g. PMOS devices) the inductor would be positioned between the switching element and ground.

In other arrangements the switching elements of the signal generating arm could be employed as a source-follower instead of common-source. This would mean that the drains of the transistors would be connected to $V_{DD}$, while the source would provide the output, and the inductor would be connected between the source and ground.

Preferably a filter is provided on the output to remove unwanted harmonics. Higher order harmonics may be generated by the switching elements. It is normally desirable to smooth these out of the output signal. In the differential embodiments a differential filter may be used for the outputs of the two signal generating arms. However, it will be appreciated that two single-ended filters could be used in its place.

The pulse generator preferably has some form of timing controller to generate signals to activate and deactivate (switch on and switch off) the switching elements. Such signals may be generated by an open-loop delay line. However, as described above, it is preferred for reasons of consistency across process variations and temperature variations to use a clocked signal to improve the timing accuracy. While the use of a clock requires more power than a simple open-loop delay line, the improvements in power consumption from the arrangement described here compensate for the inclusion of the clock, and thus allow a more accurate device to be built within other power constraints. In preferred embodiments the controller comprises a multiphase clock that generates a clock signal at a plurality of different phases, and wherein the different phases are arranged to drive the switching elements. A multiphase clock generator is particularly convenient as it allows several clock phases to be generated from a single lower frequency clock, each clock phase being separated from the others by a short time period, thus the frequency of rising edges (or falling edges) output by the multiphase clock generator is a multiple of the base clock frequency. Keeping the base clock frequency as low as possible is desirable from a power consumption perspective, while the use of multiple phases allows high frequency operation as devices (in this case switching elements) can be triggered at a triggering rate which is a multiple of the clock frequency.

The multiphase clock generator may for example be a phase locked loop (PLL) or delay locked loop (DLL) to take an input clock signal and divide it into a number of equally spaced phases. Each phase signal has the same frequency as the base clock frequency, but is separated from adjacent phases by a fraction of the base clock frequency.

In the most simple examples, the order of triggering of the switching elements may be as simple as connecting each switching element to a clock phase of the multiphase clock generator (possibly through a one-shot device to limit the active time of the switching element to less than a half clock cycle). However, improved operation can be achieved by employing a slightly more complicated arrangement. Thus, preferably each switching element is provided with enable logic that determines its activation and deactivation based on one or more clock phase signals. The enable logic may combine one or more clock phases with each other and/or with other inputs. For example, an overall enable signal may be provided that ensures pulses are only generated when desired rather than being generated with every clock cycle. This essentially allows pulse transmission to be turned off when not in use, thus saving power.

One particular benefit of the close time-spacing of adjacent phases of the multiphase clock generator is to generate short trigger pulses to control activation of the switch. Thus, preferably the enable logic comprises a one-shot device driven by two phase signals of the clock. By way of example, such a one-shot device can be formed from an AND gate with one of the inputs negated. The two inputs are taken from two adjacent clock phases and the output as a pulse that lasts only for the phase lag between the input phases. Longer pulses may of course be generated by combining non-adjacent clock phases.

For greater flexibility of timing control, the enable logic may comprise a multiplexer which takes a plurality of clock phases as inputs, and outputs one or more clock phases selected from among said inputs. The use of a multiplexer allows the activation of the associated switching element to be adjusted in time by selecting the corresponding clock phase inputs. In some examples the multiplexer may have a single clock phase output, but in other examples, particularly those employing one shots as described above, the multiplexer may output two outputs, preferably two adjacent outputs (although non-adjacent outputs may be used for longer one-shots as described above). In one particular example, the multiplexer may take three adjacent clock phases as inputs and output two adjacent clock phase inputs selected from those three.

Preferably at least one (preferably each) phase of the multiphase clock generator is used more than once (in some embodiments each phase is used twice). Preferably each phase is used in pulse generation on both a positive signal generating arm and a negative signal generating arm. This means that each phase is potentially used as part of the trigger for two different switching elements, one in the positive arm and one in the negative arm. This makes particularly efficient use of the clock phases, allowing a smaller and less complex multiphase clock generator to be used for a given number of pulses.

In particularly preferred arrangements the enable logic comprises a polarity input arranged to select between two opposite pulse polarities. The ability to generate opposite polarity pulses is particularly beneficial for implementing certain spectrum smoothing techniques, such as pseudo-random bi-phase coding. In such techniques a pseudo-random bit stream is generated and the phase of each pulse in a pulse stream is determined by the value of the corresponding bit in the bit stream. A corresponding detector which is also provided with the bit stream knows what phase of pulse to look for in the return signal.

To switch the polarity of the transmitted pulse, all positive parts of the signal must be inverted to negative and vice versa. Thus, in the case of differential embodiments, the two signal generating arms can essentially be swapped so as to reverse the polarity of the differential output. For certain complex pulse shapes, this may require a significant amount of logic to implement. However, in the case of oscillating signals that alternate between identical (or at least similar) strength switching elements of the positive and negative arm, the alternating pattern can be switched (and thus the polarity of the pulse changed) simply by starting the sequence with the opposite signal generating arm. Thus, in preferred arrangements the enable logic is arranged to trigger switching elements of the first signal generating arm and second signal generating arm alternately and wherein the polarity input is arranged to swap the alternation pattern.

In other words, the switching sequence starts with the negative signal generating arm instead of the positive signal generating arm, or vice versa. Each pair of switches in the sequence (one positive switch and one negative switch) are simply swapped in order.

By way of a specific example, in the case of a Gaussian derivative pulse, one pulse polarity may start with P1, N1, P2, N2, P4, N4, . . . (P and N denoting positive and negative signal generating arms, and the numbers indicating a current drawing power). The corresponding opposite polarity pulse would start with N1, P1, N2, P2, N4, P4, . . . and is achieved by swapping the order of the $1^{st}$ and $2^{nd}$ pulses, swapping the order of the $3^{rd}$ and $4^{th}$ pulses, swapping the order of the $5^{th}$ and $6^{th}$ pulses, etc.

In particularly preferred embodiments, the enable logic comprises a multiplexer which takes a plurality of clock phases as inputs and outputs one or more clock phases selected from among said inputs, and wherein the polarity input provides the select input to the multiplexers so as to switch the timing of the switching elements. In the case of a multiplexer that selects two adjacent clock phases from among three adjacent clock phases, the polarity input selects between a first option and a second option, the first option being the first and second adjacent phases of the multiplexer inputs and the second option being the second and third adjacent phases of the multiplexer inputs. The two adjacent phase outputs may be used to fire a one-shot device as described above. It will be appreciated that these two options vary the timing of the trigger for the switching element by one clock phase. The same arrangement (with the same input clock phases) is used for a corresponding switching element on the opposite signal generating arm, but with the first and second options being selected differently so that when the first option is selected on the first signal generating arm, the second option is selected on the second signal generating arm and vice versa. In a preferred arrangement this can be achieved by the polarity input being provided directly to one of the first and second signal generating arms and being inverted before being applied to the other of the first and second signal generating arms.

In single-ended embodiments the polarity can still be swapped by essentially the same mechanism, i.e. by timeshifting the triggers for each switching element by half a switching frequency cycle. This has the effect of moving the output pulse peaks to where there would otherwise have been a trough and vice versa. Although this is not an exact pulse inversion, it is typically close enough and provides the desired effect such that these two polarities can be used for bi-phase coding.

The above arrangements do not require particularly complicated enable logic, i.e. using only a few logic gates per switch. For more complicated pulse shapes more logic will be required at the expense of chip area, although this will likely be minor compared to the area required for the inductors. With only a small extension of the logic, the enable logic may be arranged to define a single pulse shape that spans more than a single clock cycle of the multiphase clock.

In further examples, by using additional logic to apply appropriate selection of switching element from among the full set of available switching elements and by careful selection of switching elements with appropriate strengths (different sizes of transistor), different derivative orders of a Gaussian derivative pulse may be selected. The derivative order is determined by the number of peaks/troughs and thus the number of switching elements employed to create the pulse. The derivative order affects the frequency bandwidth and can be changed to make best use of different spectral masks that apply in different countries. Further the centre frequency of the pulse can be changed by adjusting the base clock frequency of the multiphase clock generator, again allowing best filling of the available spectrum.

The overall output power may also be varied to make best use of the available spectrum. The output power of the transmitter (pulse generator) depends in part on the pulse repetition frequency (PRF) (output power scales linearly with PRF) which in turn depends on the operating conditions. For example in an impulse radar application the pulse repetition frequency may vary depending on the range that is to be investigated. Thus, it is desirable to be able to adjust the power output of the pulse generator.

In some preferred embodiments each of the first signal generating arm and the second signal generating arm comprises: a plurality of signal generating arms in parallel, all arranged to draw current through the shared inductor, wherein at least one of the parallel arms may be enabled or disabled to alter the output power of the pulse generator. By providing several parallel arms (or sub-arms or arm components) which can be selectively engaged or disengaged, the total output power of the pulse generator can be varied. For example, by operating two or more parallel arms together (fully synchronised by use of the same clock signals), both arms draw current in synchrony and add to the total power output. The different parallel arms may be identical in power. However, this need not be the case. For example, in the case of two parallel arms where one arm has twice the current draw of the other, three possible output powers are achievable using either arm individually or both together.

Other preferred features of the circuit include that the output signal may be provided to a differential antenna, the first inductor and the second inductor may be separate windings of a transformer or the first inductor and the second inductor may be formed from a single centre-tapped inductor.

According to another aspect, the invention provides a method of generating a pulse comprising: activating a plurality of switching elements of a first signal generating arm in a predetermined sequence so as to draw current through a first inductor of the first signal generating arm and thereby generating a predetermined pulse waveform at a pulse generator output.

It will be appreciated that any of the preferred and optional features described above in relation to the apparatus may be applied equally to the method.

In particular, the plurality of switching elements in the first signal generating arm may have different current drawing abilities such that upon activation they draw different amounts of current. The method may further comprise: activating a plurality of switching elements of a second signal generating arm in a predetermined sequence so as to draw current through a second inductor of the second signal generating arm, the first and second signal generating arms together generating a predetermined pulse waveform at a pulse generator output.

The switching elements of the first signal generating arm and the second signal generating arm may be activated alternately so as to produce an oscillating output. The switching elements may be activated in an order such that current drawn through successive switching elements of each signal arm increases then decreases. The predetermined sequence may be arranged to create an approximate Gaussian derivative pulse shape.

The method may comprise generating a clock signal at a plurality of different phases, and driving the switching elements from the different phases. Each switching element may be provided with enable logic that determines its activation and deactivation based on one or more clock phase signals. The enable logic may comprise a one-shot device driven by two phase signals of the clock. The enable logic may comprise a multiplexer which takes a plurality of clock phases as inputs and outputs one or more clock phases selected from among said inputs.

The method may comprise selecting a pulse polarity via a polarity input of the enable logic. A second signal generating arm may be provided and the enable logic may be arranged to trigger switching elements of the first signal generating arm and second signal generating arm alternately and wherein the polarity input is arranged to swap the alternation pattern. The polarity input may be provided directly to one of the first and second signal generating arms and may be inverted before being applied to the other of the first and second signal generating arms.

The enable logic may define a single pulse shape that spans more than a single clock cycle of the multiphase clock.

The or each signal generating arm may comprises: a plurality of signal generating arms in parallel, all arranged to draw current through the shared inductor, wherein the method comprises enabling or disabling at least one of the parallel arms to alter the output power of the pulse generator.

Preferred embodiments of the invention will now be described, by way of example only, and with reference to the accompanying drawings in which.

Figure 1A:
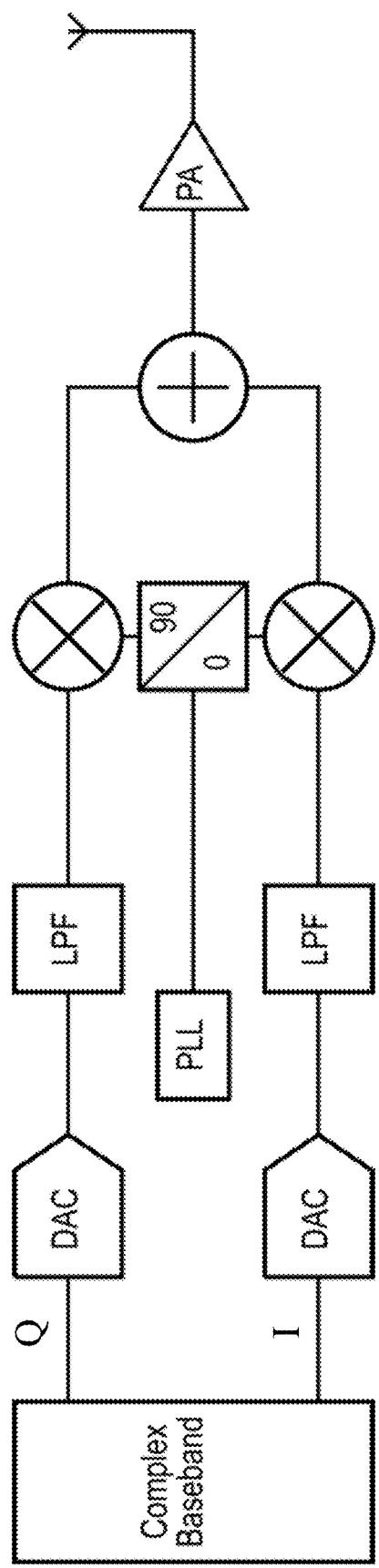
FIG. 1a shows a conventional direct conversion transmitter architecture.
Figure 1B:
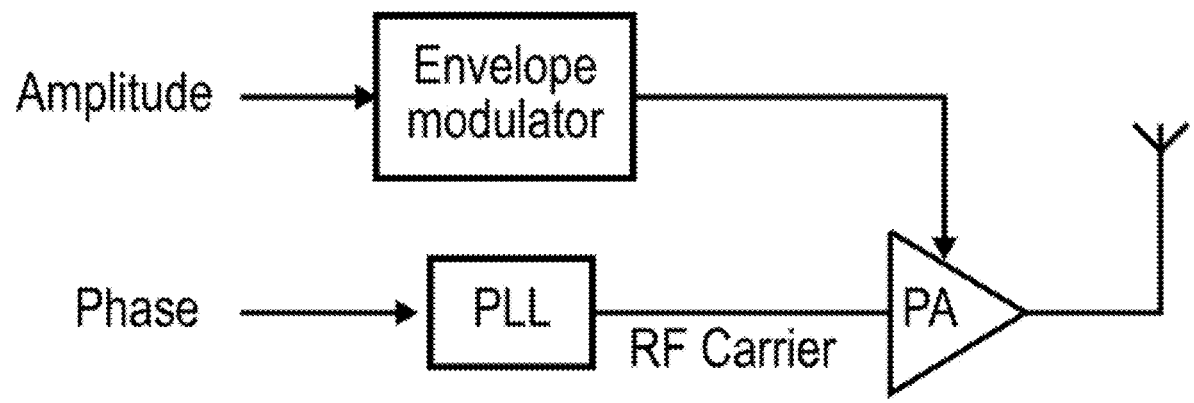
FIG. 1b shows a conventional polar transmitter architecture.
Figure 2:
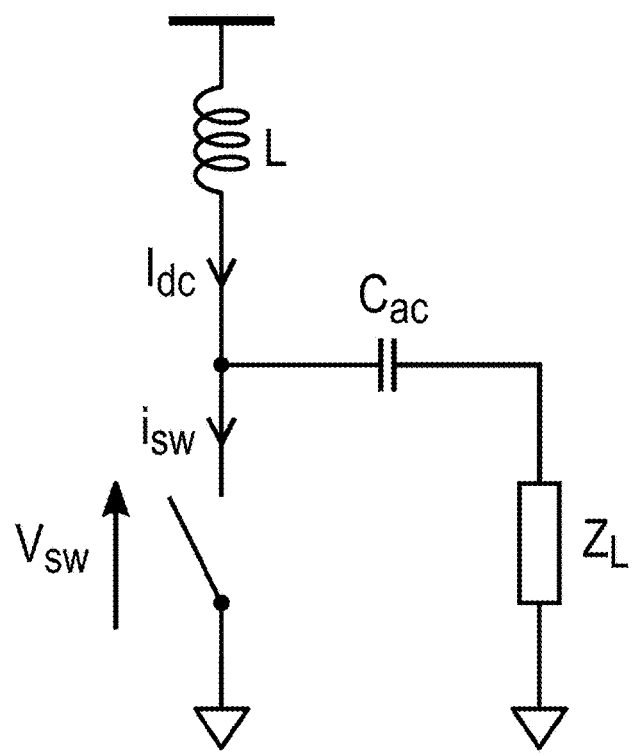
FIG. 2 shows a basic switched-mode power amplifier circuit.
Figure 3:
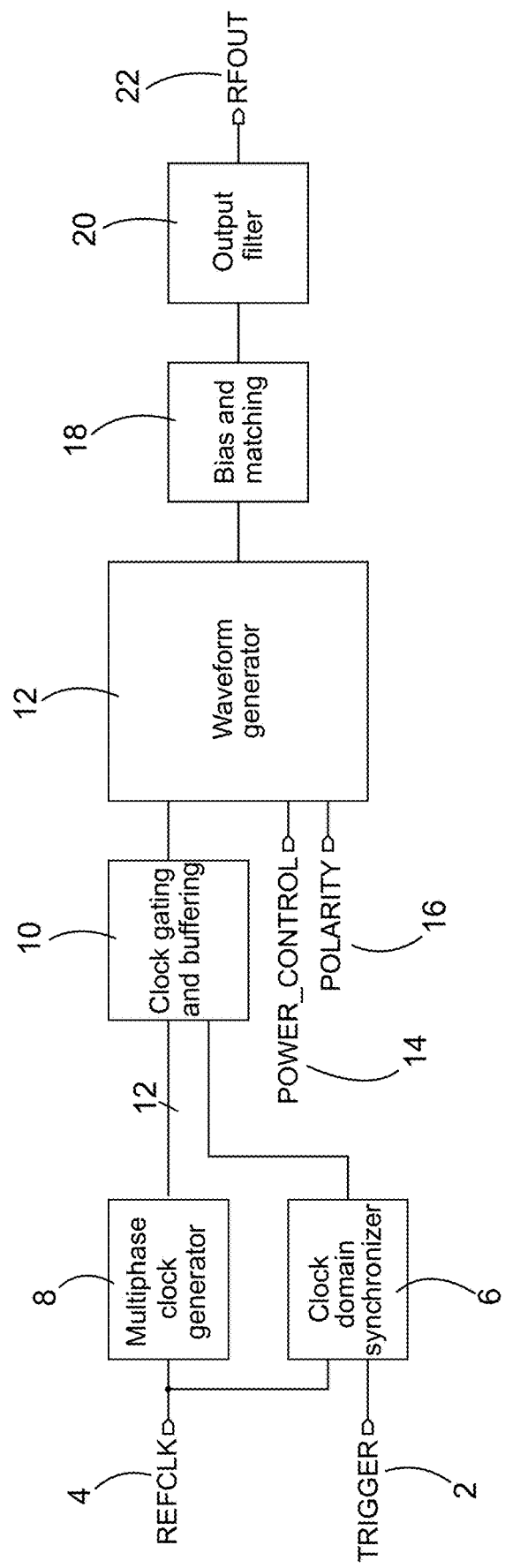
Figure 4:
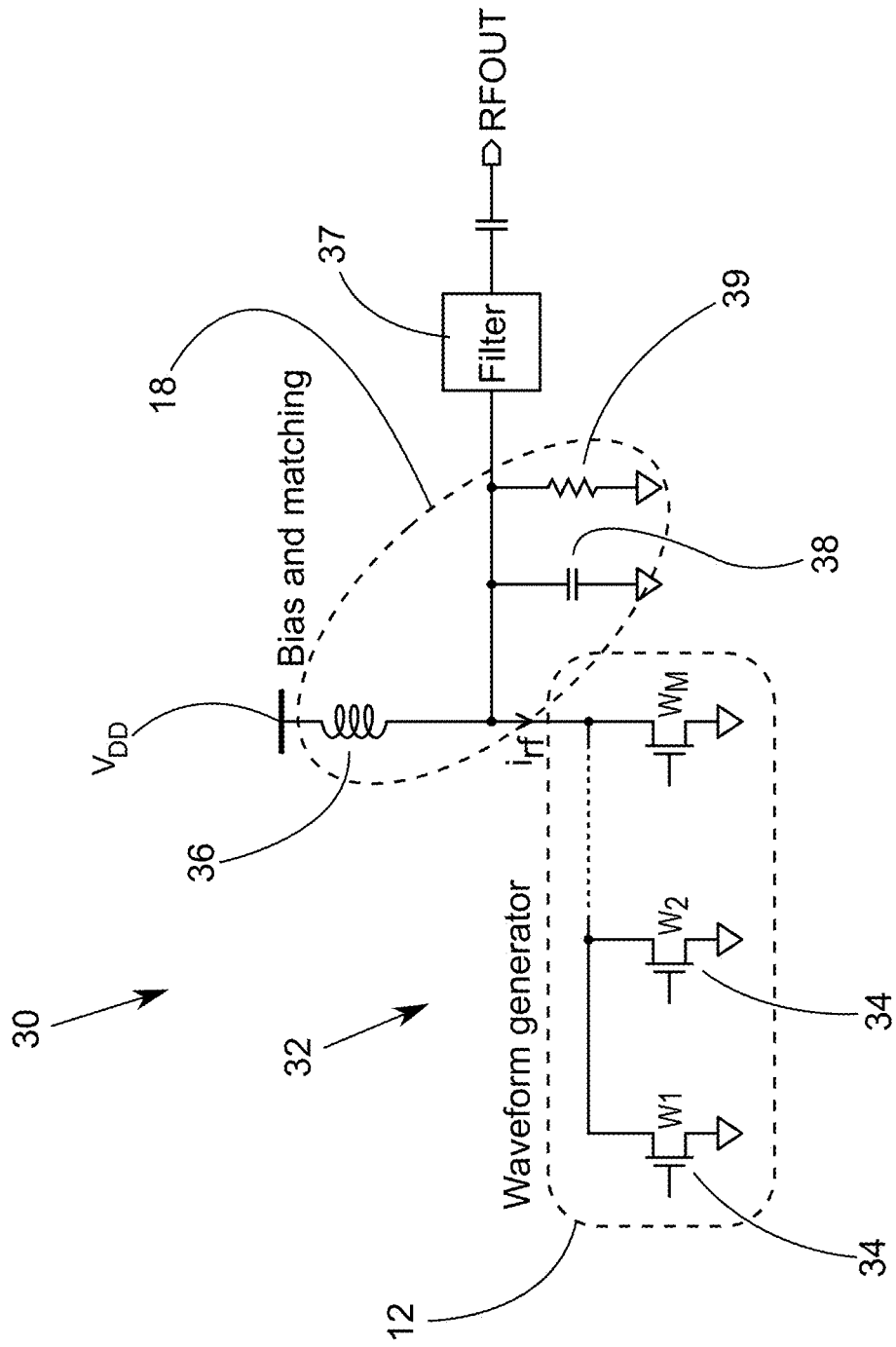
Figure 5:
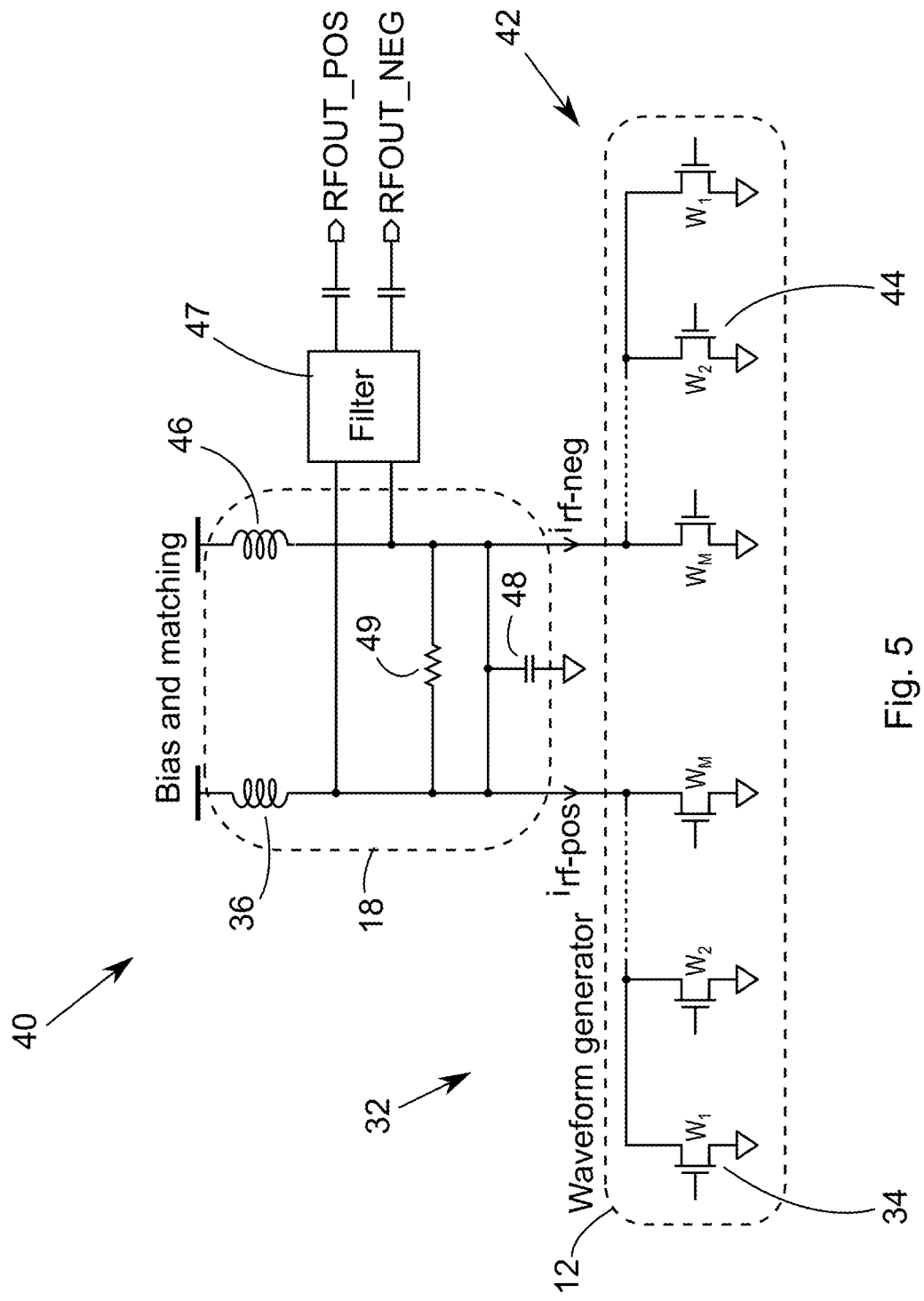
Figure 6:
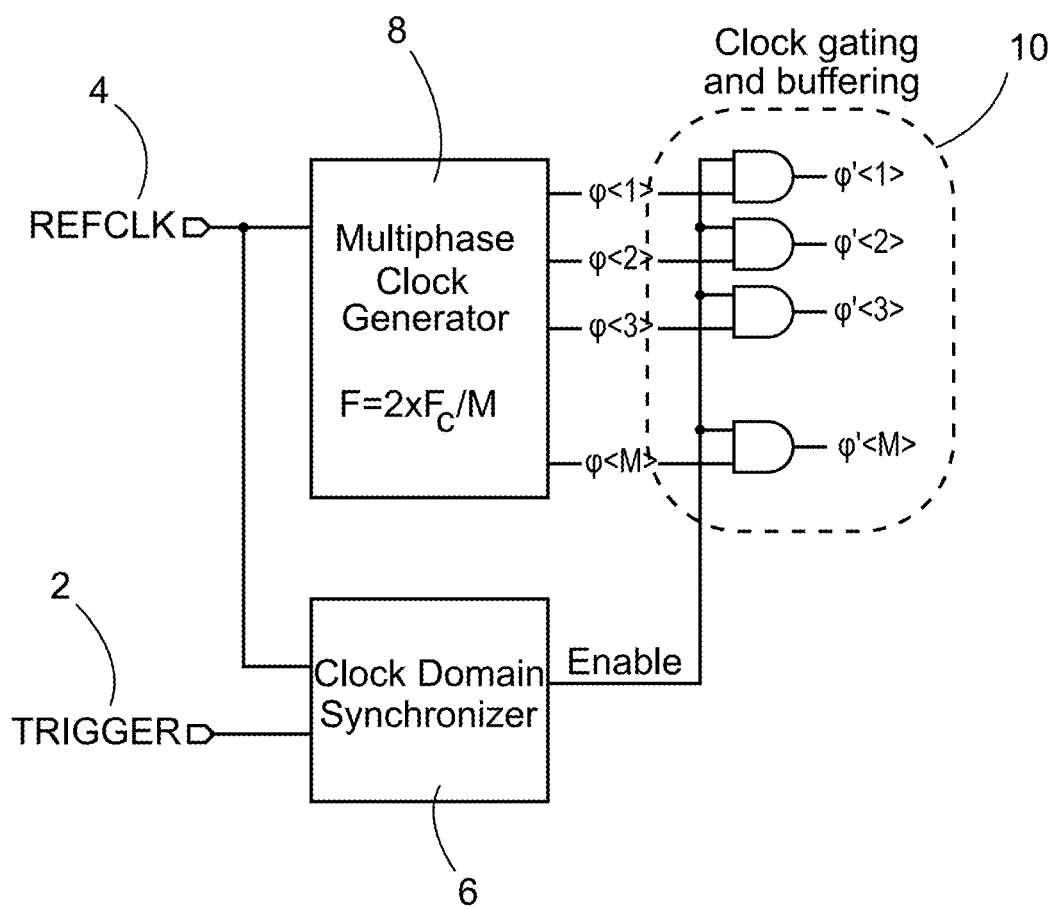
Figure 7:
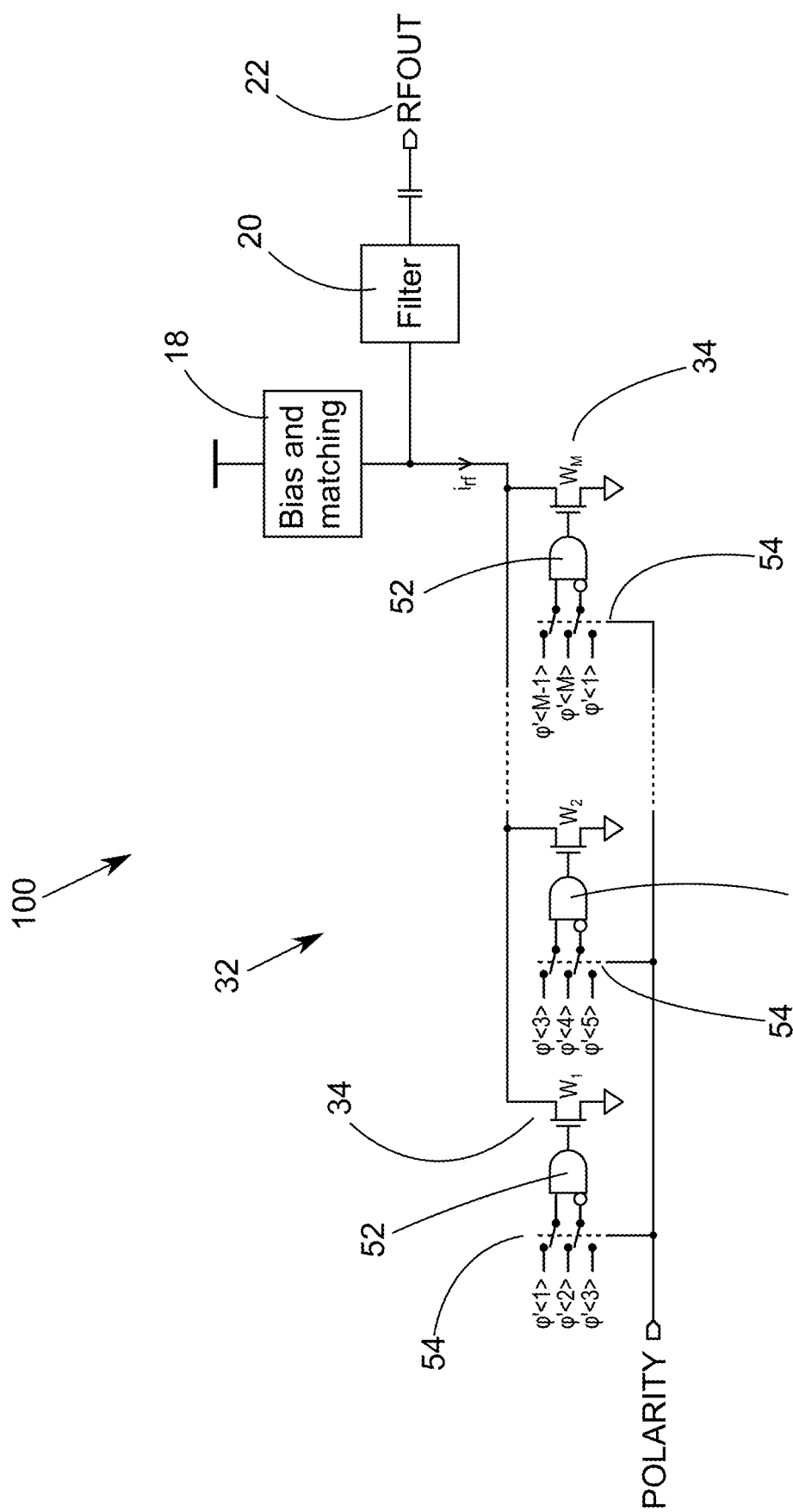
Figure 8:
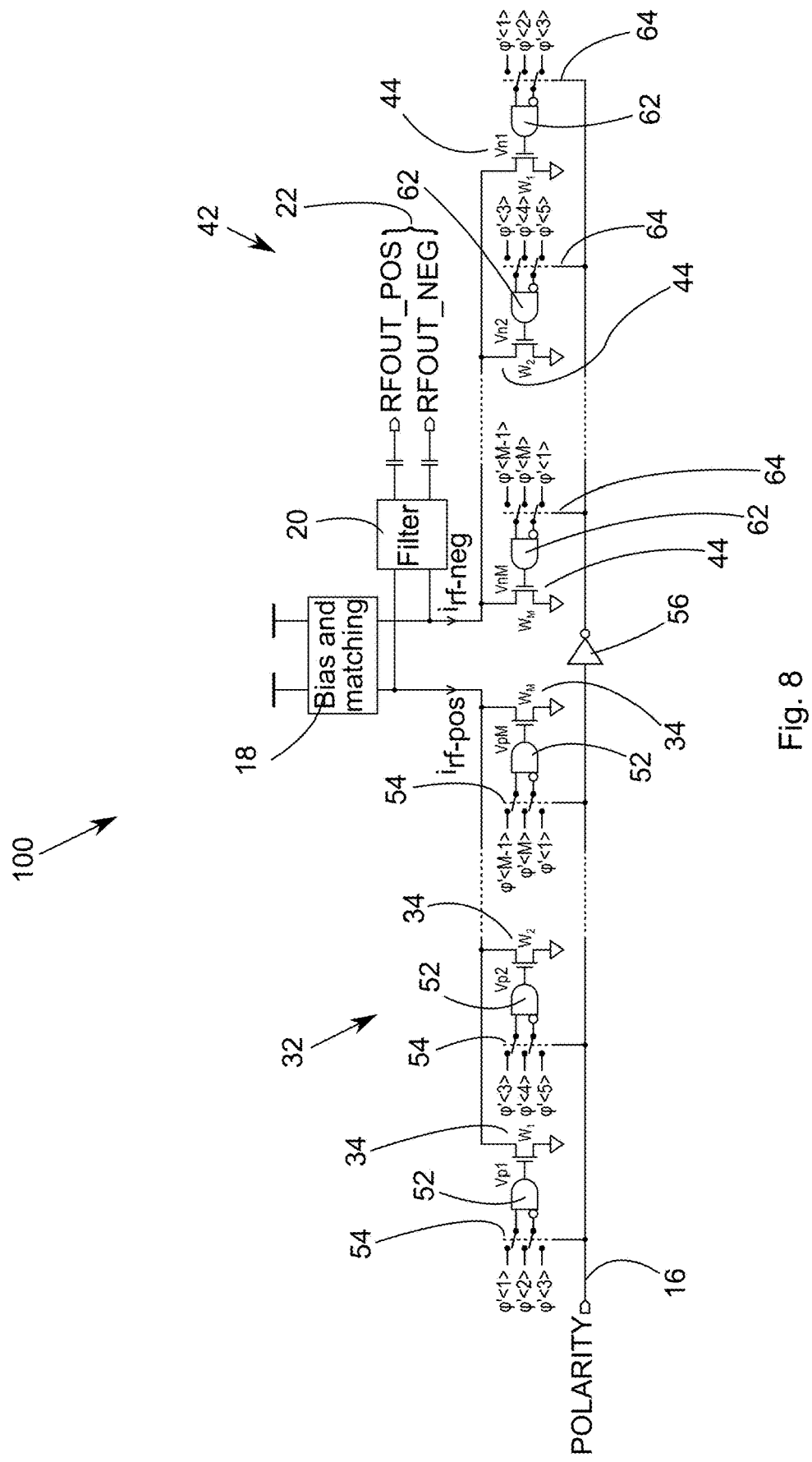
Figure 9:
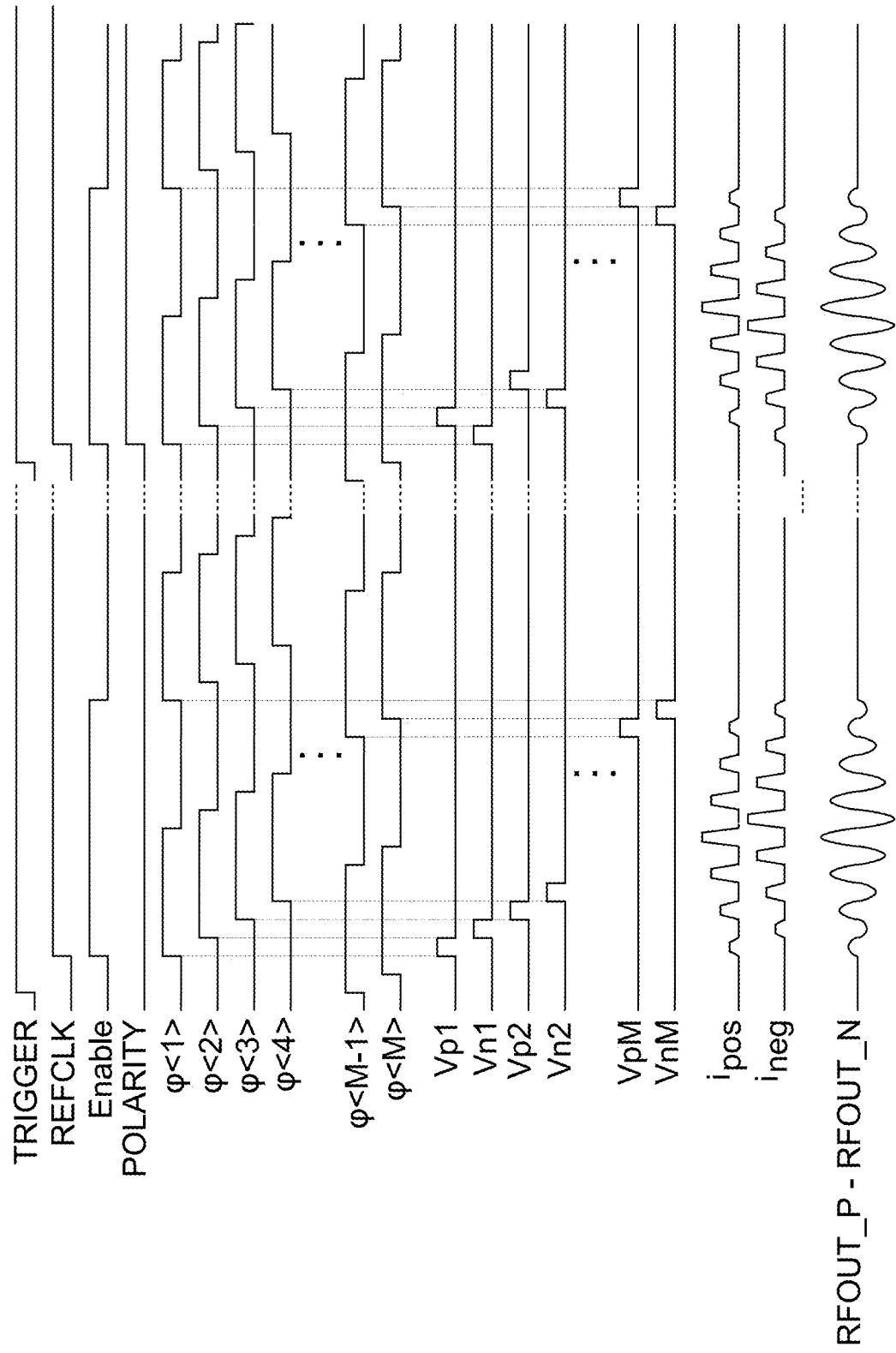
Figure 10:
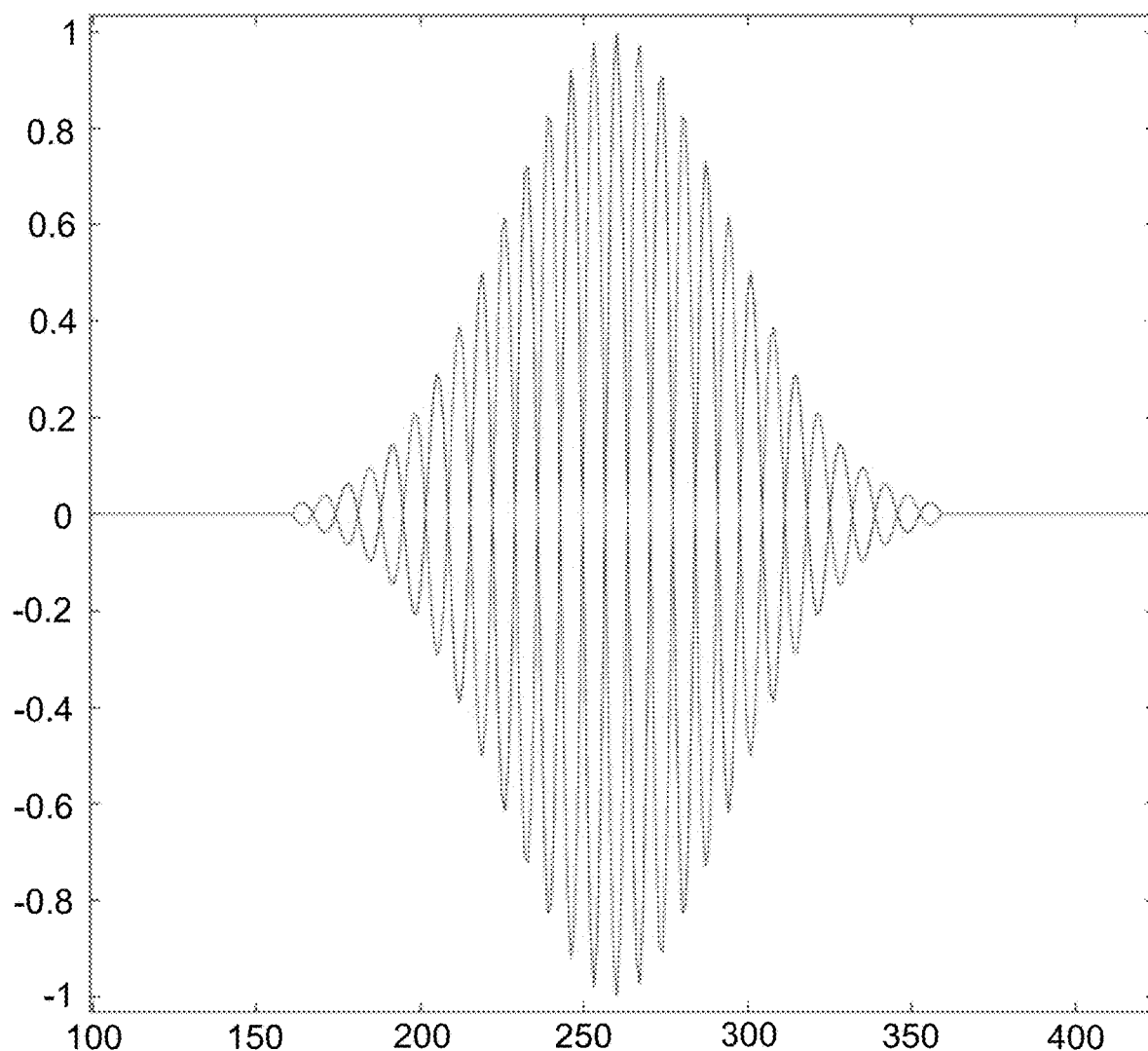
Figure 11:
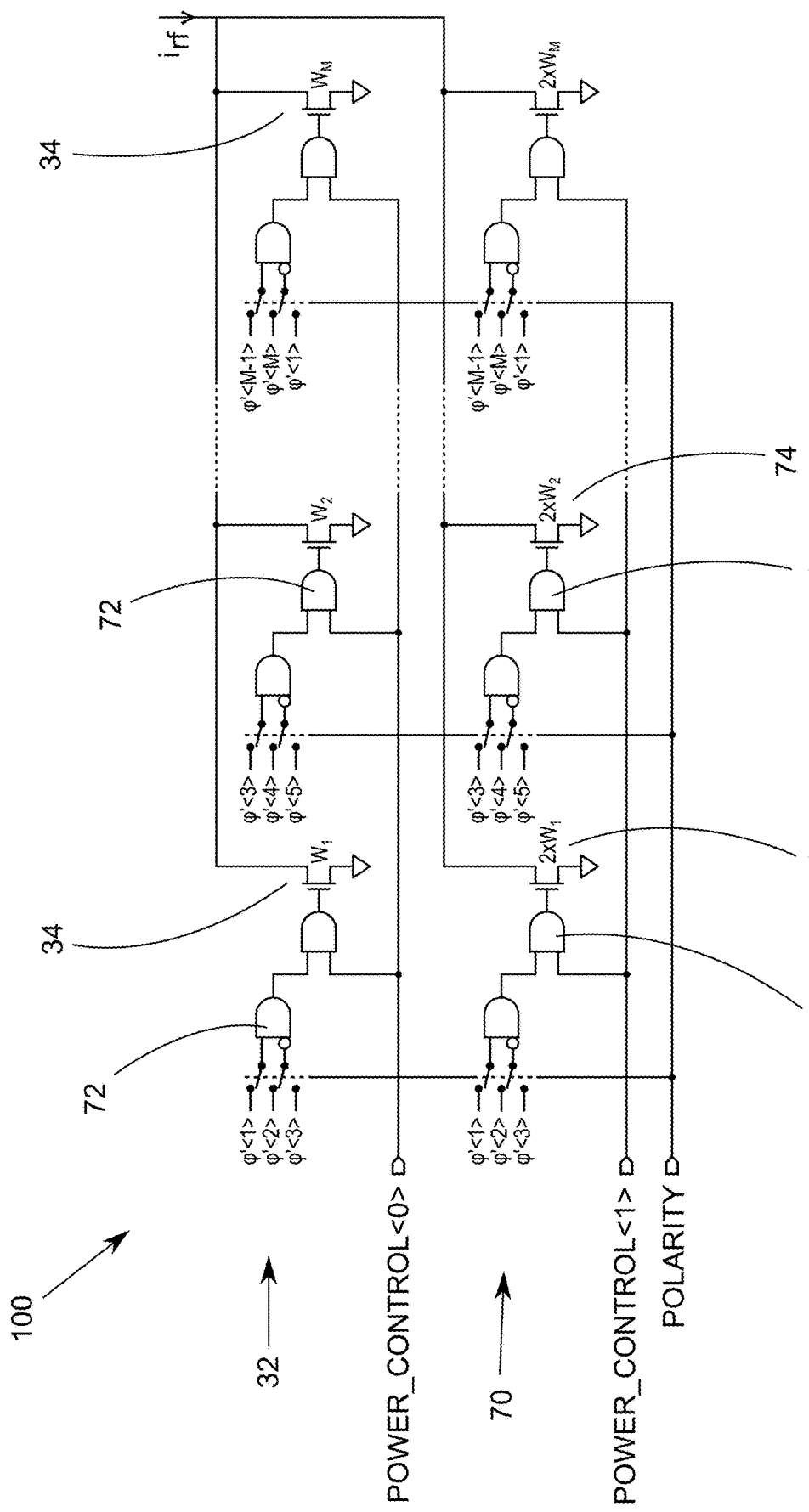

FIG. 3 schematically shows an overview of various circuit components;

FIG. 4 shows a simple single-ended pulse generator;

FIG. 5 shows a simple differential pulse generator;

FIG. 6 shows details of a clock circuit;

FIG. 7 shows more detail of a single-ended pulse generator;

FIG. 8 shows more detail of a differential pulse generator;

FIG. 9 shows signals at various points in the circuit of FIG. 8;

FIG. 10 shows two example Gaussian derivative pulses of opposite polarities; and FIG. 11 shows a single-ended pulse generator capable of generating different powers.

FIG. 3 schematically shows the various elements of the circuit. On the left hand side, a trigger signal 2 is received which is the used to trigger pulse generation. The trigger signal 2 is synchronised with a reference clock 4 by clock domain synchroniser 6. The reference clock signal 4 is also used to drive a multiphase clock generator 8 which may be a multiphase PLL or similar. The multiphase clock generator 8 outputs twelve clock phases (although the number of phases may of course be different for different implementations). Next a clock gating and buffering circuit 10 receives the synchronised trigger signal and the multiple clock phases. This will be further explained with reference to FIG. 6 below. The output signals from the clock gating and buffering circuit 10 are fed to waveform generator 12 which is the main circuit for generating and shaping the output pulse waveform from the clock/trigger inputs. The waveform generator 12 is supplied with a power control input 14 and also may in some embodiments receive a polarity input 16 which can be used to alter the polarity of the output pulse. This output of the waveform generator is fed to a bias and matching circuit 18 and then to an output filter 20. The output 22 from filter 20 may be passed to an antenna for transmission.

The waveform generator 12, bias and matching circuit 18 and output filter 20 may be either single-ended or differential.

FIG. 4 shows a simple single-ended pulse generator 30. The waveform generator 12 and the bias and matching circuit 18 are shown by dashed lines. The waveform generator 12 comprises a single signal generating arm 32 which comprises M transistors (switching elements) 34. In this embodiment the transistors 34 are NMOS devices with their sources all connected to ground and their drains all connected together. The drains are all connected to $V_{DD}$ through inductor 36. Thus inductor 36 provides the amplifier load. Inductor 36 does not dissipate any DC power which contributes to the power efficiency of the circuit (as does the non-linear operation, i.e. rail-to-rail switching of the inputs to the switching elements). The capacitor 38 may be a dedicated component, or it may simply represent parasitic capacitance (e.g. device and routing parasitics) that is experienced at that point in the circuit. Either way, the capacitor 38 and inductor 36 together form a resonant circuit that is tuned to the switching frequency so that as the switching elements 34 are triggered, the resonant circuit causes the output voltage between the inductor 36 and the transistor drains to maximally swing between ground and $2 \times V_{DD}$. The resistor 39 is provided for impedance matching purposes only. The output pulse waveform is passed through single-ended filter 37 for transmission. The switching elements 34 have different sizes or weights $W_1, W_2, \ldots W_M$ such that they have different current drawing capabilities. Thus some switching elements 34 will draw more current than others when activated. This shapes the envelope of the waveform. This shaping is hard coded into the waveform generator (although as discussed below, some variation or programmability may be possible via additional logic that can vary the triggering timing and/or sequence) and thus essentially both the carrier wave and the modulation are carried out by the same switching circuit 12.

FIG. 5 is similar to FIG. 4, but shows a differential pulse generator 40. In addition to the single-ended components described above in relation to FIG. 4, the differential pulse generator 40 also has a second signal generating arm 42 comprising a plurality of switching elements 44 in a similar arrangement to those of the first signal generating arm 32. The two signal generating arms 32, 42 together make up the waveform generator 12. The second signal generating arm 42 has its own inductor 46 which acts in the same way as the first inductor 36 to amplify the signal from the second signal generating arm. The current in the first signal generating arm 32 is shown here as $i_{rf-pos}$ and the current in the second signal generating arm 42 is shown as $i_{rf-neg}$. The outputs of the two signal generating arms 32, 42 form a differential output that is fed to differential filter 47 which in turn produces a differential output which may be transmitted for example by a differential antenna. The bias and matching circuit 18 is also similar to that of FIG. 3, although the capacitance 48 and matching resistor 49 are shared between the two signal generating arms 32, 42.

In an alternative embodiment the differential filter 47 could be replaced by two single-ended filters.

In both FIGS. 4 and 5 the inputs to the switching elements are omitted for clarity. These will be explained in more detail below.

FIG. 6 shows the generation of the timing signals that are used to activate the switching elements 34, 44. The multiphase clock generator 8 has a clock frequency F which is locked to a clock source such as a crystal oscillator, a MEMS resonator, an LC-oscillator, a relaxation oscillator, or the like. The multiphase clock generator 8 typically employs a DLL or PLL to divide the clock cycle into a number of equal phases, generating individual clock phase signals for each phase. Each clock phase signal has the same clock frequency F, but is phase shifted from the base clock signal. The M phase signals φ<1>, φ<2>, φ<3>, . . . , φ<M> are ANDed with an enable signal provided by the clock domain synchroniser 6 that gates the output clock phases of the multiphase clock generator 8 such that they are distributed to the waveform generator only upon receiving the trigger signal. As can be seen in FIG. 9, the enable signal is coherent with, and high, only for a single period of the output clock phase. When the enable signal is off (or low), no pulses will be generated for activation of the switching elements. The enabled phase signals are identical to the original clock phase outputs, but are labeled with a prime to distinguish them: φ'<1>, φ'<2>, φ'<3>, . . . , φ'<M>. It is these enabled outputs that are fed to the waveform generator 12.

It will be appreciated that the centre frequency of the waveform generated by the pulse generator is determined by the frequency of switching elements 34, 44 which is higher than the base clock frequency F by a factor M/2, M being the number of clock phases and the number of switching elements in each signal generating arm 32, 34. Thus the multiphase clock generator 8 allows the pulse generator to generate a pulse of much higher centre frequency without requiring a high base clock frequency.

FIG. 7 shows a single-ended pulse generator like that of FIG. 4, but showing the triggering mechanisms for the switching elements 34. FIG. 8 similarly shows the differential version of FIG. 7. FIG. 8 will be described in detail with the minor differences of FIG. 7 indicated where necessary.

FIG. 8 shows a circuit diagram of a pulse generator 100. The pulse generator 100 comprises two signal generating arms; a first (positive) signal generating arm 32 and a second (negative) signal generating arm 42 (FIG. 7 only has the first arm 32 as it is single-ended). The first signal generating arm 32 is connected to $V_{DD}$ through a first inductor 36. The second signal generating arm 42 is connected to $V_{DD}$ through a second inductor 46 (these being part of the bias and matching circuit 18 and shown in FIGS. 4 and 5). The first signal generating arm 32 has M switching elements 34 (with weights W1 to WM) in the form of NMOS FETs, each with its drain connected to the inductor 36 and its source connected to ground (as shown in FIGS. 4 and 5). The switching elements 34 have different strengths (weights) so that they have different current drawing capabilities. This is achieved through appropriate sizing of the NMOS devices at fabrication time.

Each switching element 34 is driven by a one-shot device 52 which in this example is formed from an AND gate with one of its inputs negated. The inputs of the one-shot device 52 are provided by adjacent clock phase signals, with the earlier phase being provided to the non-negated input and the later phase being provided to the negated input so that the AND gate activates the switching element 34 only between the rising edge of the earlier clock phase input and the rising edge of the later clock phase input.

The clock phases that are provided to the one-shot device 52 are not hard-coded into the circuit in this example (although they could be in other examples), but rather are selectable by way of multiplexers 54. Each multiplexer 54 in this example has three selectable inputs and outputs two of those inputs as its outputs. In this example the three inputs of each multiplexer 54 are adjacent clock phase inputs (although each multiplexer 54 in the first signal generating arm 32 has a different set of three clock phases as inputs). By way of example, the multiplexer 54 for the first switching element on the positive signal generating arm (with weight $W_1$ and gate voltage Vp1) takes inputs from the first three clock phases in the cycle: φ'<1>, φ'<2> and φ'<3> and the multiplexer 54 can output either the first two phases φ'<1>, φ'<2> or the second two phases φ'<2>, φ'<3> depending on its selector input. (As described above, these clock phases are actually the enabled clock phase signals). The next multiplexer 54 on the first signal generating arm 32, for the second switching element (with weight $W_2$ and gate voltage Vp2) takes inputs from the third to fifth clock phases in the cycle: φ'<3>, φ'<4> and φ'<5> and the multiplexer 54 can output either the first two phases φ'<3>, φ'<4> or the second two phases φ'<4>, φ'<5> depending on its selector input. The second switching element is thus fired at a later time step than the first switching element. A similar arrangement is provided for each of the switching elements in the first (positive) signal generating arm 32, all equally spaced in time from one another and with a time gap between the firing of adjacent positive switching elements 34. A similar arrangement is also provided for all of the switching elements 44 on the second (negative) signal generating arm 42.

The selector input for all multiplexers 54 of the first (positive) signal generating arm 32 is taken from a common input, namely the polarity input 16. When the polarity input 16 is low (indicating a first polarity of the output pulse), the multiplexers 54 all select the earliest two phases from their three inputs. When the polarity input 16 is high (indicating a second, opposite polarity of the output pulse), the multiplexers 54 all select the later two phases from their three inputs. Thus, when the polarity input 16 changes from low to high, all the switching elements 34 of the first (positive) signal generating arm 32 move one slot later in phase in the clock cycle.

The second (negative) signal generating arm 42 is identical to the first (positive) signal generating arm 32, although it is arranged here in mirror image. However, the polarity input 16 is passed through an inverter 56 so that the opposite selecting signal is provided to the multiplexers 64 in the second signal generating arm 42 as compared with the signal provided to the multiplexers 54 in the first signal generating arm 32. The consequence of this is that when the multiplexers 54 of the first signal generating arm 32 are firing their respective switching elements 34 in the earlier of the two possible time slots, the corresponding (mirror image) multiplexers 64 of the second signal generating arm 42 are firing their respective switching elements 44 in the later of the two possible time slots. When the polarity signal 16 reverses, this situation reverses so that the first signal generating arm 32 generates pulses later and the second signal generating arm 42 generates pulses earlier.

It may be appreciated that in this arrangement each phase of the multiphase clock generator 8 is used twice (i.e. the phases are re-used), once in the positive arm, generating a positive pulse and once in the negative arm, generating a negative pulse. For example in FIG. 9 it can be seen that φ<2> is used both in generating the falling edge of Vp1 and the rising edge of Vn1. This makes efficient use of the clock phases, using each phase more than once which minimises the complexity required of the multiphase clock generator.

From the above description it can be appreciated that for a given polarity signal 16, the switching elements 34, 44 of the first and second signal generating arms 32, 42 activate alternately so as to produce an oscillating output waveform. The polarity input 16 determines whether the signals of the two arms 32, 42 are interleaved starting with the positive arm 32 or starting with the negative arm 42 and thus allows the pulse generator 100 to generate identical pulses of opposite polarity simply by setting the polarity input 16.

The strengths of the switching elements 34, 44 are set in this example to produce a Gaussian derivative waveform, i.e. the strengths (weights) of the switching elements 34, 44 form a Gaussian envelope defining the amplitude of the oscillating waveform. Thus, the weights $W_1$ and $W_M$ are low relative to the other weights (designed to create a low amplitude oscillation when these switching elements 34, 44 are fired), the weights $W_2$ and $W_{M-1}$ are higher than $W_1$ and $W_M$ and so on, with a maximum amplitude in the middle of the sequence and with the amplitudes approximating the Gaussian curve. An example of two opposite pulse polarities is shown in FIG. 10 with the two opposite polarities overlaid on one another such that the peaks of one waveform align with the troughs of the other waveform.

FIG. 9 shows a timing diagram for the signals at various points in a differential pulse generator circuit. Reference will be made to FIG. 6 and FIG. 8. At the top of FIG. 9, the TRIGGER signal 2 has a rising edge that triggers the pulse generation sequence. Two such rising edges are shown in FIG. 9. The REFCLK signal 4 is not initially aligned with the TRIGGER signal 2, but the clock domain synchroniser 6 ensures that after the rising edge of the TRIGGER signal 2, the processing begins in line with the REFCLK signal 4. An Enable signal is generated with the same phase as one of the clock phases φ<1> of the multiphase clock generator 8 and with twice the period (i.e. the high half-cycle spans both a high and a low cycle of φ<1>. In other embodiments the Enable signal may in principle have any duration, as long as both the rising and falling edges are synchronous to one of the φ<n>. The POLARITY signal defines the polarity of pulse that is to be output. The POLARITY signal changes from low to high for the second TRIGGER signal in FIG. 9 so that the left hand side of FIG. 9 generates one polarity while the right hand side of FIG. 9 generates the opposite polarity.

Clock phases φ<1> to φ<M> are shown, each with the same clock frequency, but with their phases shifted progressively in time. The one shots 52 output a short trigger pulse based on two adjacent clock phase signals as described above. The voltage waveforms for the one shot pulses for some of the switching elements 34, 44, namely Vp1, Vn1, Vp2, Vn2, VpM and VnM are shown in FIG. 9 The effect of the POLARITY signal can be seen here; on the left hand side of FIG. 9 the pulse sequence starts with positive arm, Vp1, then negative arm Vn1, then positive arm Vp2, etc., while on the right hand side of FIG. 9, the pulse sequence starts with negative arm Vn1, then positive arm Vp1, then negative arm Vn2, etc. The effect of these triggering sequences, combined with the differing weights of the switching elements 34, 44 can be seen in the $i_{pos}$ and $i_{neg}$ waveforms. Again it can be seen clearly that on the left hand side $i_{pos}$ leads $i_{neg}$, while on the right hand side $i_{neg}$ leads $i_{pos}$. The final output from the differential signal is shown as RFOUT_P−RFOUT_N which clearly shows two approximate Gaussian derivative pulses, with different polarities on the left and right hand sides of the figure.

FIG. 11 shows a single-ended pulse generator 100 similar to that of FIGS. 4 and 7. However, in addition to the structure shown in those figures, the pulse generator 100 has a programmable output power by providing two parallel signal generating arms 32 and 70. The local one shot 52 now drives another AND gate 72. The other input to the AND gate 72 is the POWER_CONTROL<x> signal, which in this embodiment is either POWER_CONTROL<0> (for signal generating arm 32) or POWER_CONTROL<1> (for signal generating arm 70). It will be appreciated that this can readily be extended to include further options. The width (size) of the output transistors are scaled such that the second set of transistors 74 driven from the same set of clock phases have a width of twice the first set of transistors 34. It will be appreciated that other ratios of transistor sizing could also be used.

Enabling POWER_CONTROL<0> only results in an output pulse of relative power 1, enabling POWER_CONTROL<1> only results in an output pulse of relative power 2, while enabling both signals results in an output pules of relative power 3 (=2+1). Disabling both signals generates no output pulse. Note that all transistor outputs (drains) are connected to the same node and thus draw current through the same inductor 36.

The invention claimed is:

1. A pulse generator comprising:
a first signal generating arm comprising a first inductor and a plurality of switching elements, each arranged to draw current through the first inductor; and
a controller arranged to activate the plurality of switching elements in a predetermined sequence so as to generate a predetermined pulse waveform at a pulse generator output, wherein:
the plurality of switching elements in the first signal generating arm are arranged to draw different amounts of current; and
the plurality of switching elements have different current drawing capabilities to generate peaks and troughs at the pulse generator output of different amplitude; and
wherein the predetermined sequence is arranged to create an approximate Gaussian derivative pulse shape.

2. A pulse generator as claimed in claim 1, wherein the plurality of switching elements are transistors and the current drawing ability of each transistor is defined by sizing of the transistors.

3. A pulse generator as claimed in claim 1, further comprising:
a second signal generating arm comprising a second inductor and a plurality of switching elements, each arranged to draw current through the second inductor; and
wherein the controller is arranged to activate the plurality of switching elements of the first and second signal generating arms in a predetermined sequence so as to generate a predetermined pulse waveform as a differential signal between a first pulse generator output on the first signal generating arm and a second pulse generator output on the second signal generating arm.

4. A pulse generator as claimed in claim 3, wherein the controller is arranged to activate switching elements of the first signal generating arm and the second signal generating arm alternately so as to produce an oscillating output.

5. A pulse generator as claimed in claim 3, wherein the controller is arranged to activate the switching elements in an order such that current drawn through successive switching elements of each signal arm increases then decreases.

6. A pulse generator as claimed in claim 1, wherein each switching element is connected through the respective inductor to a high voltage rail.

7. A pulse generator as claimed in claim 1, further comprising a filter provided on the output to remove unwanted harmonics.

8. A pulse generator as claimed in claim 1, wherein the controller comprises a multiphase clock that generates a clock signal at a plurality of different phases, and wherein the different phases are arranged to drive the switching elements.

9. A pulse generator as claimed in claim 8, wherein each switching element is provided with enable logic that determines its activation and deactivation based on one or more clock phase signals.

10. A pulse generator as claimed in claim 9, wherein the enable logic comprises a one-shot device driven by two phase signals of the clock.

11. A pulse generator as claimed in claim 9, wherein the enable logic comprises a multiplexer which takes a plurality of clock phases as inputs and outputs one or more clock phases selected from among said inputs.

12. A pulse generator as claimed in claim 11, wherein the multiplexer takes a plurality of adjacent clock phases as inputs.

13. A pulse generator as claimed in claim 12, wherein the multiplexer outputs at least two adjacent clock phases.

14. A pulse generator as claimed in claim 8, wherein at least one phase of the multiphase clock generator is used more than once in generating the pulse waveform.

15. A pulse generator as claimed in claim 14, wherein each phase of the multiphase clock generator is used in pulse generation on both a positive signal generating arm and a negative signal generating arm.

16. A pulse generator as claimed in claim 9, wherein the enable logic comprises a polarity input arranged to select between two opposite pulse polarities.

17. A pulse generator as claimed in claim 16, further comprising:
a second signal generating arm comprising a second inductor and a plurality of switching elements, each arranged to draw current through the second inductor; and
wherein the enable logic is arranged to trigger switching elements of the first signal generating arm and second signal generating arm alternately and wherein the polarity input is arranged to swap the alternation pattern.

18. A pulse generator as claimed in claim 17, wherein the enable logic comprises a multiplexer which takes a plurality of clock phases as inputs and outputs one or more clock phases selected from among said inputs, and wherein the polarity input provides the select input to the multiplexers so as to switch the timing of the switching elements.

19. A pulse generator as claimed in claim 18, wherein the polarity input is provided directly to one of the first and second signal generating arms and is inverted before being applied to the other of the first and second signal generating arms.

20. A pulse generator as claimed in claim 9, wherein the enable logic is arranged to define a single pulse shape that spans more than a single clock cycle of the multiphase clock.

21. A pulse generator as claimed in claim 1, wherein the or each signal generating arm comprises:
a plurality of signal generating arms in parallel, all arranged to draw current through the shared inductor, wherein at least one of the parallel arms may be enabled or disabled to alter the output power of the pulse generator.

22. A pulse generator as claimed in claim 1, comprising a second signal generating arm that comprises a second inductor and a plurality of switching elements, each arranged to draw current through the second inductor; and wherein the first inductor and the second inductor are separate windings of a transformer.

23. A pulse generator as claimed in claim 1, comprising a second signal generating arm that comprises a second inductor and a plurality of switching elements, each arranged to draw current through the second inductor; and wherein the first inductor and the second inductor are formed from a single centre-tapped inductor.

24. A pulse generator as claimed in claim 1, wherein the first inductor, and optionally second inductor are on-chip inductors.

25. A method of generating a pulse comprising:
activating a plurality of switching elements of a first signal generating arm in a predetermined sequence so as to draw current through a first inductor of the first signal generating arm and thereby generating a predetermined pulse waveform at a pulse generator output, wherein:
the plurality of switching elements in the first signal generating arm are arranged to draw different amounts of current; and
the plurality of switching elements have different current drawing capabilities to generate peaks and troughs at the pulse generator output of different amplitude; and
wherein the predetermined sequence is arranged to create an approximate Gaussian derivative pulse shape.

26. A pulse generator comprising:
a first signal generating arm comprising a first inductor and a plurality of switching elements, each arranged to draw current through the first inductor; and
a controller arranged to activate the plurality of switching elements in a predetermined sequence so as to generate a predetermined pulse waveform at a pulse generator output, wherein;
the plurality of switching elements in the first signal generating arm are arranged to draw different amounts of current, and;
the plurality of switching elements have different current drawing capabilities to generate peaks and troughs at the pulse generator output of different amplitude;
wherein the controller comprises a multiphase clock that generates a clock signal at a plurality of different phases, and wherein the different phases are arranged to drive the switching elements;
wherein each switching element is provided with enable logic that determines its activation and deactivation based on one or more clock phase signals;
wherein the enable logic comprises a polarity input arranged to select between two opposite pulse polarities;
the pulse generator further comprising a second signal generating arm comprising a second inductor and a plurality of switching elements, each arranged to draw current through the second inductor;
wherein the enable logic is arranged to trigger switching elements of the first signal generating arm and second signal generating arm alternately and wherein the polarity input is arranged to swap the alternation pattern;
wherein the enable logic comprises a multiplexer which takes a plurality of clock phases as inputs and outputs one or more clock phases selected from among said inputs, and wherein the polarity input provides the select input to the multiplexers so as to switch the timing of the switching elements; and
wherein the polarity input is provided directly to one of the first and second signal generating arms and is inverted before being applied to the other of the first and second signal generating arms.

27. A pulse generator comprising:
a first signal generating arm comprising a first inductor and a plurality of switching elements, each arranged to draw current through the first inductor; and
a controller arranged to activate the plurality of switching elements in a predetermined sequence so as to generate a predetermined pulse waveform at a pulse generator output, wherein;
the plurality of switching elements in the first signal generating arm are arranged to draw different amounts of current, and;
the plurality of switching elements have different current drawing capabilities to generate peaks and troughs at the pulse generator output of different amplitude;
the pulse generator further comprising a second signal generating arm that comprises a second inductor and a plurality of switching elements, each arranged to draw current through the second inductor;
wherein the first inductor and the second inductor are formed from a single center-tapped inductor.

* * * * *